(12) United States Patent
Serebryanskiy

(10) Patent No.: US 10,848,168 B1
(45) Date of Patent: Nov. 24, 2020

(54) REAL-TIME DIGITAL WAVEFORM AVERAGING WITH SUB-SAMPLING RESOLUTION

(71) Applicant: Guzik Technical Enterprises, Mountain View, CA (US)

(72) Inventor: Valeriy Serebryanskiy, Santa Clara, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 16/856,136

(22) Filed: Apr. 23, 2020

Related U.S. Application Data

(60) Provisional application No. 62/934,680, filed on Nov. 13, 2019.

(51) Int. Cl.
*H03M 1/06* (2006.01)
(52) U.S. Cl.
CPC .................. *H03M 1/0658* (2013.01)
(58) Field of Classification Search
USPC ................................. 341/122–155
See application file for complete search history.

(56) References Cited

U.S. PATENT DOCUMENTS

| | | | | |
|---|---|---|---|---|
| 5,610,606 A | * | 3/1997 | Fukunaga | H03M 3/348 341/143 |
| 6,377,199 B1 | * | 4/2002 | Watanabe | G06J 1/00 341/118 |
| 8,040,267 B2 | * | 10/2011 | Shirasaka | G01P 13/045 341/155 |
| 10,345,339 B2 | | 7/2019 | Tan et al. | |
| 2007/0083128 A1 | * | 4/2007 | Cote | A61B 5/7203 600/544 |
| 2012/0250748 A1 | * | 10/2012 | Nguyen | G01S 13/90 375/224 |

\* cited by examiner

*Primary Examiner* — Lam T Mai
(74) *Attorney, Agent, or Firm* — Burns & Levinson, LLP; Joseph M. Maraia

(57) ABSTRACT

Noise suppression is achieved by averaging a sequence of repetitive waveforms with correction of frequency distortions, establishing a real time processing of signals. First, the waveforms are processed seriatim, and saved in partitioned memory. Then, the memory contents are merged to form an output digital signal. Initially, an input repetitive signal is sampled with a sampling period T, and divided into K sections along the sampling period so that a $k^{th}$ section, where $0 \leq k < K$, coincides with segment $[k \cdot T/K, (k-1) \cdot T/K]$. Time displacement detection determines relative positions of trigger pulses and edges of the sampling clock, and the number k of a sampling period section where the trigger pulse appears, keeping k unchanged thereafter. A resultant stream of N·K samples is transmitted through a lowpass filter, followed by decimation by K, to complete the averaging.

4 Claims, 6 Drawing Sheets

REAL-TIME DIGITAL WAVEFORM AVERAGING WITH SUB-SAMPLING RESOLUTION

CROSS REFERENCE TO RELATED APPLICATIONS

This application claims priority to and the benefit of U.S. Provisional Patent Application No. 62/934,680, filed on Nov. 13, 2019 and titled "REAL-TIME DIGITAL WAVEFORM AVERAGING WITH SUB-SAMPLING RESOLUTION", the contents of which are incorporated herein by reference as though fully set forth herein.

TECHNICAL FIELD

The present disclosure relates to high speed analog-to-digital converters (ADC) and, more particularly, to improvement of converter accuracy by digital waveforms averaging.

BACKGROUND

Digital averaging is used as a method of repetitive waveforms detection and/or measurement in low signal-to-noise (SNR) environments typical for high speed digitizers and digital oscilloscopes. Digital averaging is also used in wide bandwidth radio frequency communications, radar, signal processing, scientific research and other applications.

Digital waveform averaging improves signal to noise ratio proportionally to square root of a number of averages. Depending on a required SNR gain, a large number of averaging cycles may be required (e.g., $10^6$ averages can result in 60 dB SNR improvement). A block diagram of a conventional device 10 for repetitive waveforms averaging is shown in FIG. 1.

In the block diagram of FIG. 1, a sequence of the analog repetitive waveforms is applied to a signal input 10A of device 10. An analog to digital converter (ADC) 12 transforms that applied analog waveform sequence into stream of digital samples. The start of each applied waveform in the applied sequence, is identified and marked by a trigger pulse from an external trigger, which is applied by way of a trigger input 10B. The trigger pulse actuates an address counter 14 which is stepped by a sampling clock source applied by way of a clock input 10C. In this way, the address counter 14 "counts" the samples produced by ADC 12. During each sampling pulse-to-pulse interval, the address counter 14 forms at an output, a serial number for a sample, representing a "current" waveform of the applied sequence.

In addition to ADC 12 and address counter 14, device 10 comprises an accumulator 16 (typically in the form of a memory unit having a signal input 16A, a control read/write input 16B and an address input 16C) and a register 18. The read/write (R/W) input 16B receives the sampling clock signal, so that in the first half of a sampling interval, the accumulator 16 is in a "read" mode, while in the second half of that sampling interval, the accumulator 16 is in a "write" mode. The number at the address input 16C of the accumulator 16 equals the number produced by the address counter 14 and shows the serial number of the current sample. An output 16D of the accumulator 16 is connected to a signal input 18A of the register 18 while the clock input 10C receives the sampling clock. A falling edge of the sampling clock writes by way of an input 18A, into the register 18, an amount/value which has been read from the accumulator (memory) 16 in the previous half of sampling period (it is the amount/value which has been saved in a memory cell of accumulator (memory) 16 with the number equal to the number of the then-current sample). That amount/value appears at an output 18B of register 18 and is applied to a first input 20A of an adder 20 and, by adder 20, is added to a then-current sample value applied from an output of ADC 12 to a second input 20B of adder 20. Since, in the second half of the sampling interval, the accumulator 16 is in a writing mode, the sum is written into the memory cell of accumulator (memory) 16 with a number equal to the number of the current sample. In this way, the samples representing the current wave form of the applied sequence are added to the contents of the accumulator 16.

After the number of the waveforms saved in the accumulator reaches a specified value, the accumulated sum is read from the memory of accumulator 16, producing at the accumulator output 16D, the result of waveforms averaging. In this manner, the problem of repetitive waveforms averaging becomes solved, however the procedure which has been described, has a serious disadvantage.

In particular, the stream of waveforms at the signal input 10A and the sampling clock 10C, are unbound; those signals are asynchronous. However, the start of a waveform may appear at any arbitrary point inside a sampling interval. The distance between the instant of the waveform start (i.e., the instant of trigger pulse appearance) and the next sample is a random variable which lies in a range from zero to T, where T is the sampling period. As a consequence, the assembly of samples representing a waveform, is shifted in time in relation to the waveform start by this random value.

The mutual disposal of the ADC samples and the trigger pulse, with indication of the sampling interval and delay of the samples assembly from waveform start, are shown in FIG. 2. Where i is the number of a waveform $f_i(t)$ and is the time displacement of samples relative to the start of the waveform which they represent, the average of N waveforms is:

$$<f(t)> = \frac{1}{N}\sum_{i=1}^{N} f(t-\varepsilon_i).$$

A Fourier transform of an average signal equals the average of Fourier transforms of the individual waveforms. A reasonably close approximation of the statistics of the time displacements $\varepsilon_i$ is obtained by a uniform distribution within the interval [0,T], where T is the sampling period. The Fourier transform of a uniform distribution (characteristic function) has a frequency response given by:

$$<F(\omega)> = F(\omega)\frac{\sin(\omega T/2)}{\omega T/2}. \quad (1)$$

This frequency response is shown in FIG. 3 for a signal frequency normalized to Nyquist frequency. For example, use of a 32 GSa/s ADC results in 2.2 dB attenuation of 12 GHz signal after averaging.

FIG. 4 illustrates the impact of trigger pulse jitter relative to the ADC sampling period on the waveforms averaging. A Linear Frequency Modulated (LFM) pulse having 7 ns duration and frequency range from 1 GHz to 12 GHz, is shown in part (a) of FIG. 4. That signal has a uniform 1V amplitude. Part (b) of FIG. 4 demonstrates result of 10000 waveforms averaging with random digital trigger position relative to ADC sampling clock of 32 GSa/s. As may be seen in part (b), the averaged signal is distorted with increasing attenuation toward the pulse end, corresponding to higher frequencies.

Equation (1) and FIG. 3 show that the spectrum of the average signal $<F(\omega)>$ differs from the real spectrum $F(\omega)$ of the unshifted waveform $f(t)$: the high frequency components of the averaged signal are suppressed as compared to the low frequency components. In a number of applications, such frequency distortions of the processed signal prevent the use of averaging for noise suppression or, at least, reduce the efficiency of such a suppression. For this reason, serious efforts are made in practice, to reduce the frequency distortions which appear during averaging a stream of repetitive waveforms.

A method and apparatus for improving the accuracy of measurement instruments by minimizing effects, such as higher frequency components attenuation in the process of increasing signal to noise ratio through averaging repetitive waveforms, were proposed in U.S. patent Ser. No. 10/345, 339. According to that patent, the phase of the averaged signal $<f(t)>$ is computed by performing a Fast Fourier Transform (FFT). In a similar way, phases of the individual waveforms are calculated and then phase differences between each individual waveform, and the phase of the averaged signal, are determined. The phase differences are used to find time shifts $\varepsilon_i$ for each waveform. To compensate the encountered time shifts, the result of the FFT which was performed on each individual waveform, is multiplied by $\exp(j \cdot 2\pi \cdot f \cdot \varepsilon_i)$. The compensated FFT results are averaged and converted to the time domain, in order to obtain averaged time domain result.

The method and apparatus of the U.S. patent Ser. No. 10/345,339 (the "'339 patent") provide for an accurate correction of frequency distortions which appear during averaging of a sequence of repetitive waveforms. However, the necessity to perform a pair of direct and inverse FFTs of each waveform (which may be done only at the sampling frequency of the ADC) requires a great quantity of computing recourses, which, in turn, prevents real time realization of the proposed approach. Another serious disadvantage of the proposed method and apparatus of the '339 patent, consists of the use of the concept of signal phase. This concept is applicable to signals with high signal to noise ratio only. It is impossible to speak about phase of an arbitrary signal. This fact significantly narrows the possible areas of application of the proposed problem solution of the '339 patent.

The goal of the present disclosure is to provide a method and apparatus of noise suppression by averaging a sequence of repetitive waveforms with correction of frequency distortions, thereby establishing a real time realization and processing of all kinds of signals.

DETAILED DESCRIPTION

Figure 1:
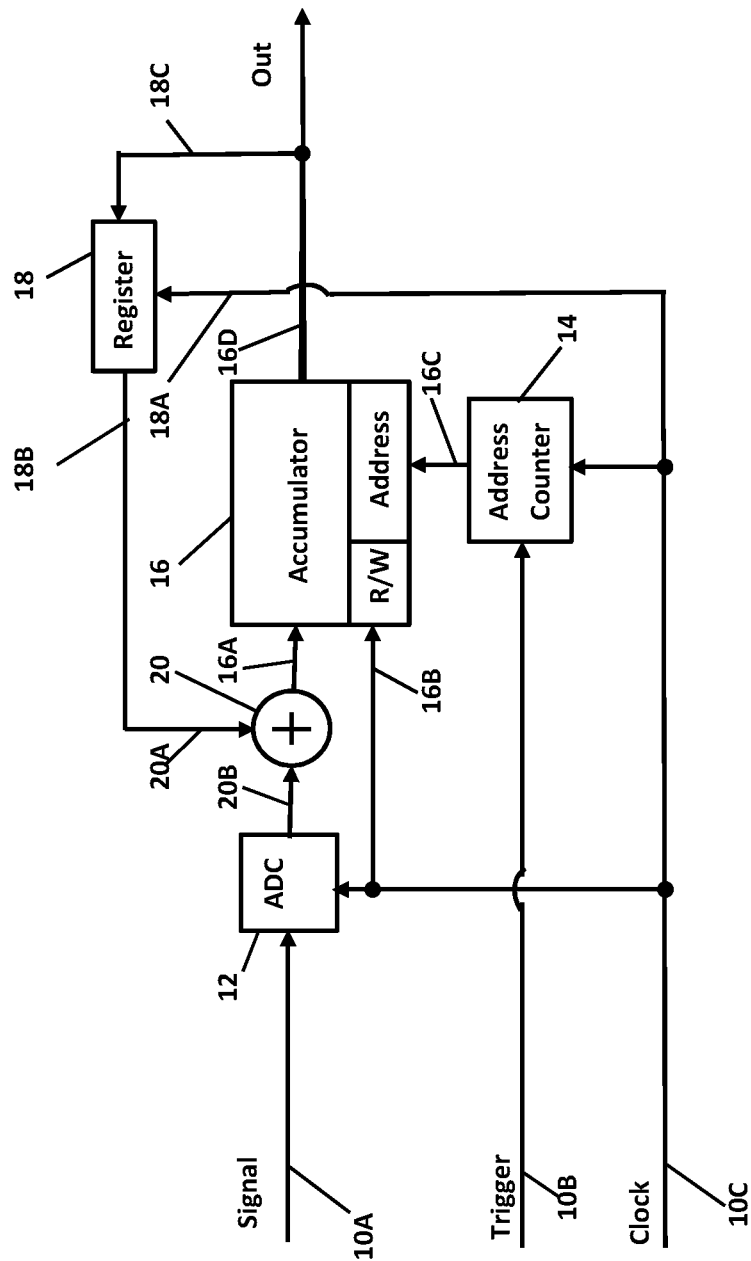
FIG. 1 depicts a block diagram of prior art waveforms averaging.
Figure 2:
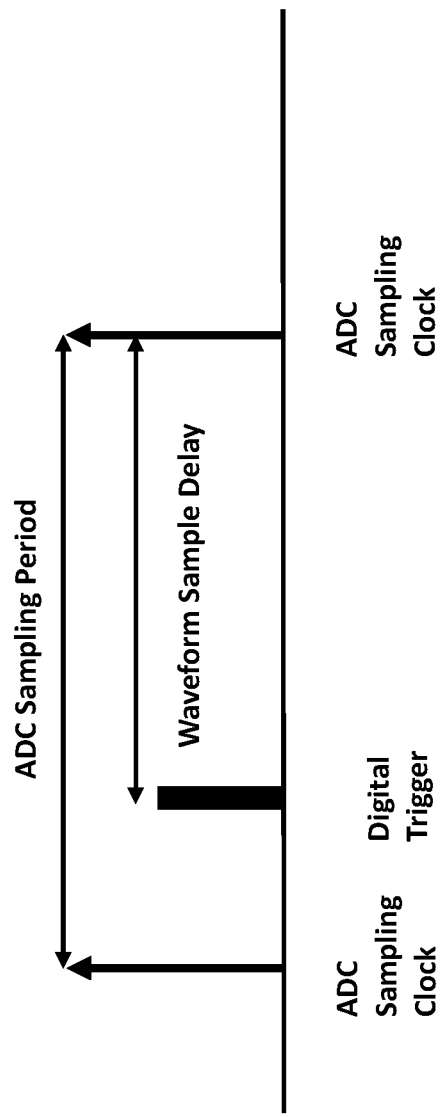
FIG. 2 shows a timing diagram, illustrating relative disposition of a trigger pulse and an ADC sampling clock period.
Figure 3:
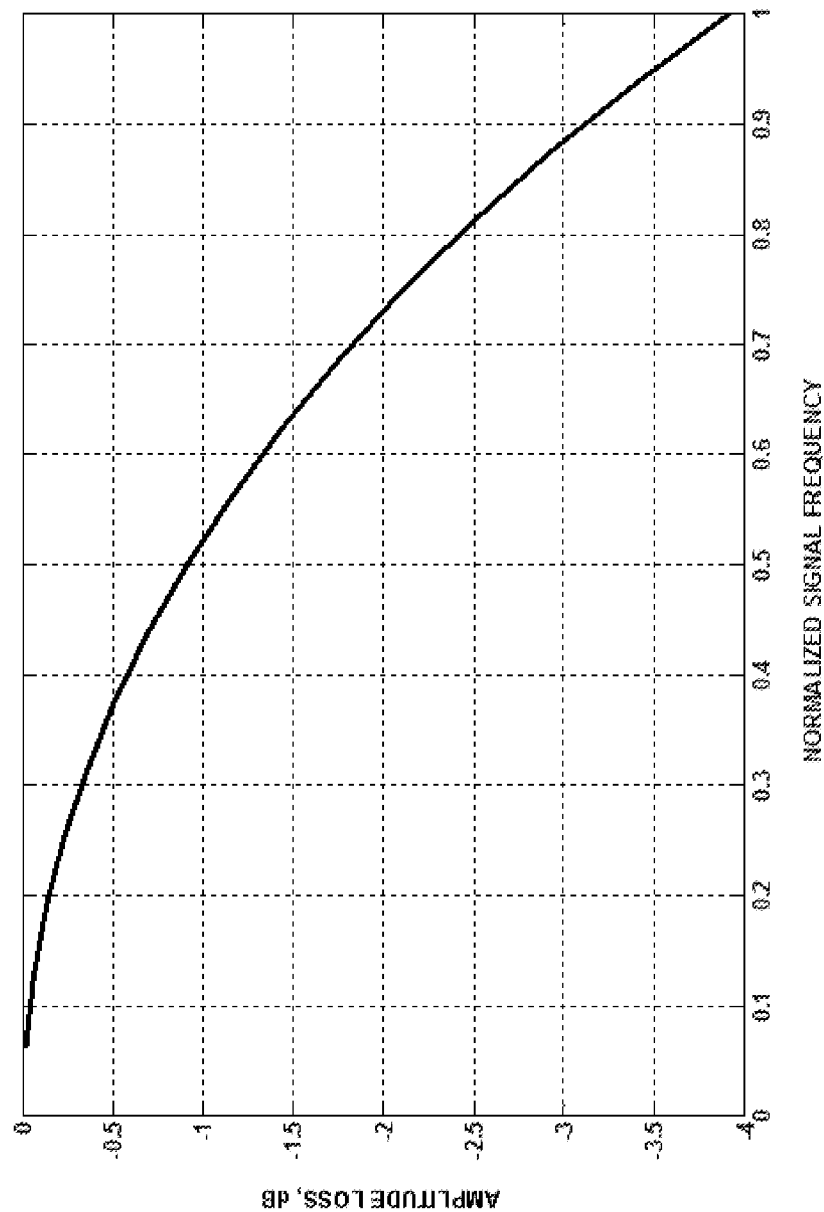
FIG. 3 shows the signal loss because of imperfect averaging, depending on component frequency.
Figure 4:
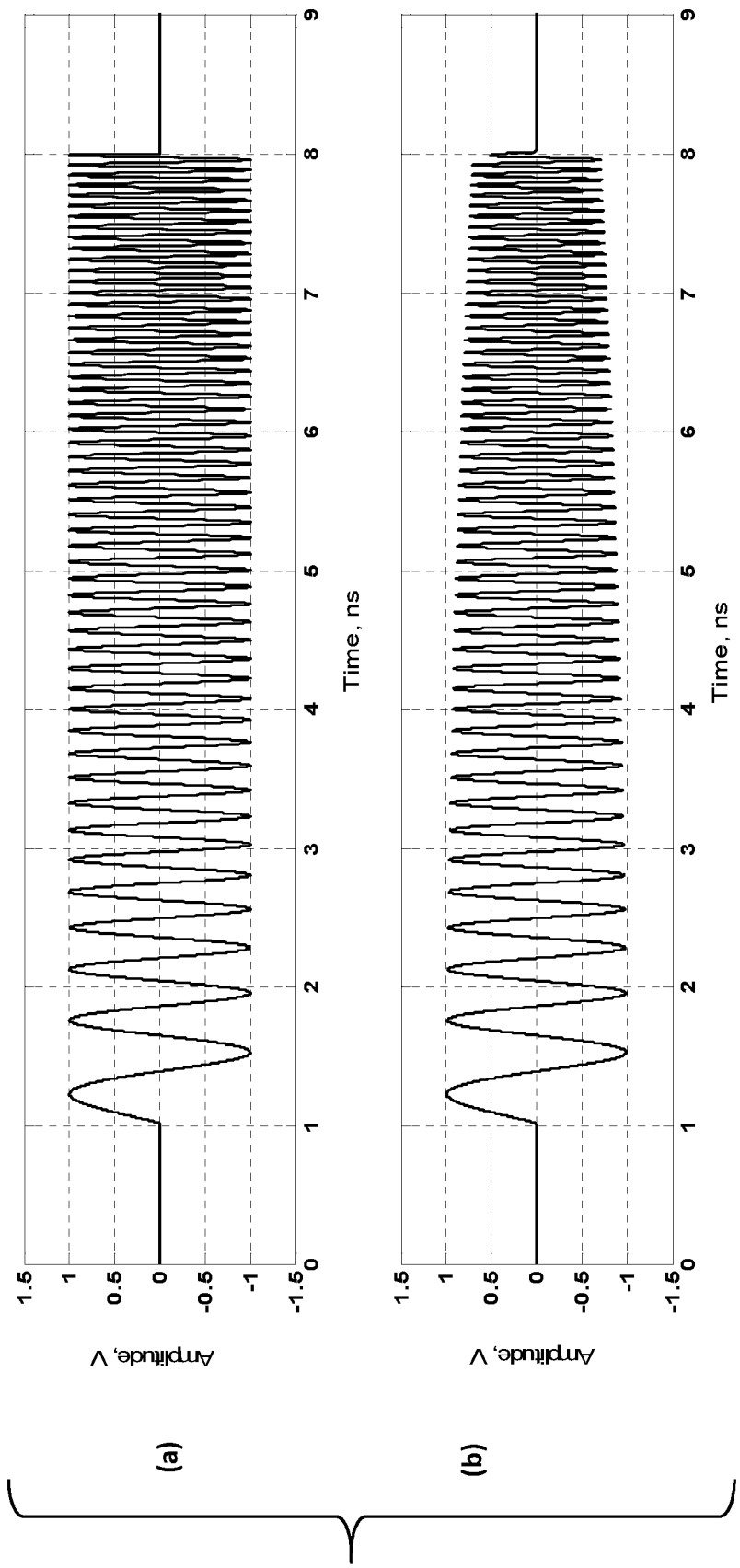
FIG. 4 shows an example of signal distortion caused by imperfect averaging.

According to the current disclosure, during the averaging of a sequence of repetitive waveforms, the processing of the next waveform begins with the operation of time displacement detection. For this purpose, a sampling period T is divided into K sections of equal length. The sections are arranged uniformly along the sampling period, so that a section with the number k, where $0 \leq k < K$, coincides with the segment $[k \cdot T/K, (k-1) \cdot T/K]$. The time displacement detection is performed through an analysis of relative positions of the trigger pulse and the edges of the sampling clock. The time displacement detection determines the number k of a sampling period section where the trigger pulse appear and keeps it unchanged up to the end of the waveform processing.

The intermediate averaging results are saved in a memory. At the start of a measurement, all memory cells are reset to zero. The coming analog values of the waveform are converted into digital samples. The samples are numbered in sequence, beginning with the zero sample, which has appeared immediately or on a specified ADC samples number after the trigger pulse, and finishing with the sample number N−1, where N is the number of samples in a waveform, where the number N is known beforehand as a parameter of the arrangement.

The memory is divided into K bins. If a waveform is being processed for which the time displacement detection produced the number k, then the samples produced by the waveform analog to digital conversion, are used to renew the contents of the memory cells belonging to the k-th bin. If the analog to digital conversion produced a sample with the serial number n, then the address of the memory cell to be refreshed, is obtained by concatenation of the numbers k and n: address=(k, n). The renewal of memory cell contents consists of the reading the contents of the cell, followed by an addition of the new sample with the number n to the contents which just have been read, and then writing the sum back to the same call.

When the preliminary specified number of waveforms have been processed, the step of data acquisition is finished. At this point of time, the memory contains K sets of samples, with each set consisting of N samples. The set with the number k is the result of averaging of all waveforms with the time displacement k.

The next step of processing the input sequence of waveforms, consists of forming an output data stream. At this step, the memory contents are read, where the address (k, n) of the memory cell to be read is formed in the following manner: reading starts from the address (0, 0), and at each cycle of the sampling clock, the number k is increased by one starting from zero and extending up to K−1 inclusively. Then the number n is increased by one, after which the number k is reset to zero and the sequence of K+1 readings is repeated. The reading stops when the address (K−1, N−1) is reached.

The process of reading just described, produces stream of N·K samples. This stream is transmitted through a low pass filter with the cutoff frequency determined by the Nyquist frequency of the processed waveforms. A decimation by K of the filter output signal is performed. The thereby-obtained signal is used as the result of the desired averaging.

Figure 5:
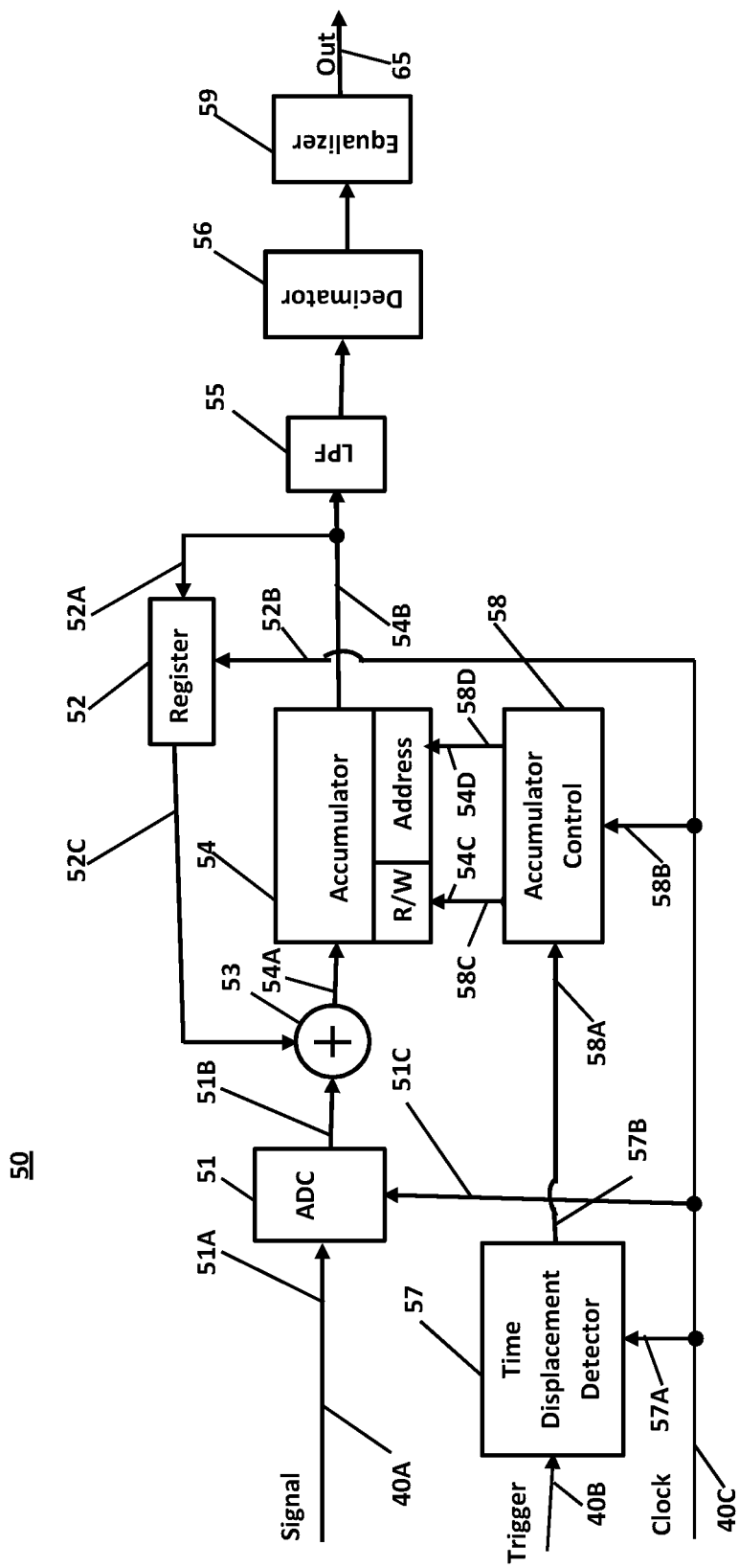
FIG. 5 shows a block diagram of an exemplary embodiment of the present disclosure.

A block diagram of an exemplary embodiment of a waveform averaging apparatus 50 of the disclosure, for averaging a sequence of repetitive waveforms, is shown in FIG. 5. As shown, apparatus 50 includes as principal elements, an analog to digital converter (ADC) 51, a register 52, an adder 53, an accumulator(memory) 54, a low pass filter 55, a decimator 56, a time displacement detector 57, an accumulator control 58, an equalizer 59, and a system output 65. ADC 51 includes an ADC input 51A coupled to a signal input 40A, an ADC output 51B, and an ADC clock input 51C coupled to a clock input 40C. Adder 53 includes a first adder input coupled to ADC output 51B, a second adder input, and an adder output. Accumulator 54 includes an accumulator input 54A coupled to the adder output, and an accumulator output 54B. Accumulator 54 further includes a read/write (R/W) input 54C and an address input 54D. Accumulator controller 58 includes a control trigger input 58A, a controller clock input 58B coupled to a clock input 40C, and a first control output 58C coupled to R/W input 54C of accumulator 54, and a second control output 58D coupled to address input 54D of accumulator 54. Time displacement detector 57 includes a detector input 57A coupled to a trigger signal input 40B, and a detector output 57B coupled to the accumulator control trigger input 58A. Register 52 includes a register input 52A coupled to the accumulator output 54B, a register clock input 52B, and a register output 52C coupled to the second adder input. Low pass filter 55, decimator 56, and equalizer 59 are coupled in series between the accumulator output 54B and system output 65.

In the block diagram of FIG. 5, a signal input 40A of apparatus 50 is adapted to receive a sequence of analog repetitive waveforms-to-be-averaged, and apply that analog sequence to an ADC input 51A of an analog to digital converter (ADC) 51. ADC 51 transforms that applied analog waveform sequence into a stream of digital samples at an ADC output 51B.

In operation of the configuration of FIG. 5, ADC 51 converts input analog waveforms applied to signal input 40A into successive streams of digital samples. Time displacement detector 57 receives a trigger pulse and sampling clock from inputs 40B and 40C, and produces a number k, which indicates the section [T/K·k, T/K·(k+1)] of the sampling period T where the trigger pulse occurred. The time displacement detector 57 keeps the number k at detector output 57B all the time during the processing of a current waveform.

Accumulator 54 is employed to save intermediate results of averaging the samples, which represent the input signal. Accumulator 54 constitutes a memory, which has signal input 54A connected to the output of the adder 53, a control read/write input 54C, address input 54D, and an output. When in a "write" mode, accumulator/memory 54 saves a sample coming from adder 53 in a memory cell with an address equal to a number coming to the address input 54D. In a "read" mode, accumulator/memory 54 produces at its output 54B, a value, which has been kept in the addressed memory cell.

Accumulator 54 receives the read/write signal at input 54C and the address signal at input 54D, from the accumulator control unit 58. The accumulator control unit incorporates an address counter which is reset to zero by each trigger pulse at input 58A and is advanced by the sampling clock at input 58B. In this way, the address counter operates synchronously with ADC 51 and produces at its output 58D, a serial number n of a current sample produced by ADC 51, wherein said serial number n indicates the position of the sample inside the waveform being processed. The accumulator control 58 also incorporates a concatenation unit. At the acquisition step, when the apparatus 50 is accumulating intermediate averaging results, the concatenation unit combines the number k received from the time displacement detector 57, with the sample number n, provided by the address counter of accumulator control 58. In such a manner, the concatenation unit produces an address in a form (k, n), which is placed at the address output 58D of the accumulator control 58.

Furthermore, the accumulator control 58 comprises a bins counter, which is a counter by modulus K (where K is the parameter of the time displacement detector 57). This bins counter is used at the step when an output data stream is formed (after the acquisition step is finished). At the beginning of the output forming step, the bins counter is reset to zero and thereafter is advanced by the sampling clock. During the step of output forming of the measurement, the numbers from the bins counter output are directed to the input of the concatenation unit instead of the number k from the time displacement detector 57.

The read/write output of the accumulator control 58 at the acquisition step, translates the clock signal to the R/W input 54C of accumulator 54. As a result, accumulator 54 in the first half of the sampling period, is in a "read" mode, and in the second half, is in "write" mode. During the step of output forming, accumulator control 58 continually sends a "Read" signal to the R/W input 54C of accumulator 54.

During the acquisition step, at each sampling interval, ADC 51 produces a new sample. The accumulator control 58 sends to the address input 54D of accumulator 54, an address of the form (k, n), and sets command "Read" at R/W input 54C. Accumulator 54 produces at its output, the contents of the memory cell with the address (k, n). This value goes to the signal input 52A of register 52, and is written into the register 52 by the falling edge of the sampling clock applied to register clock input 52B. During the second half of the sampling interval, the register 52 repeats at its output 52C, the value from the memory cell with the address (k, n). The adder 53 adds up the sample which has been produced by ADC 51, and the value from output 52C of register 52. The sum proceeds to the signal input 54A of accumulator and is written to its memory by a "Write" command which is set at accumulator R/W input 54C in the second half of the sampling interval by the accumulator control 58. In this way, the sample produced by ADC 51 is added to the contents of the memory cell of accumulator 54 with the address (k, n), with the sum being saved in the same memory cell.

At the end of the acquisition step, sums of different sets of waveforms are saved in different accumulator bins, whereas the sum of waveforms which starts appear in the section [T/K·k, T/K·(k+1)] of the sampling interval, are saved in the bin of the accumulator with the number k.

At the step of output forming, the contents of accumulator 54 are read, whereas during the sampling interval with the number m, the address (k, n) of the memory cell to be read, is determined with the use of equations: k=m mod K, n=m/K. The digital signal from output 54B of accumulator 54 passes through LPF 55. The cutoff frequency of LPF 55 is preferably chosen to be slightly less than $F_s/K/2$, where $F_s$ is the frequency of the sampling clock. At the output of the LPF 55, each sample equals the average of K adjacent samples. Decimator 56, following LPF 55, eliminates K−1 samples from each group of K adjacent samples, producing in this way, a digital signal equal to the average of the digital signals which have been saved in different bins.

As shown in FIG. 5, the output of decimator 56 is connected to the input of equalizer 59, thereby correcting the frequency response of apparatus 50. The output of the equalizer 59 is used as the output of apparatus 50. The function of the equalizer 59 is to reduce distortions of the amplitude frequency response and of the dependence of group delay on frequency. There are two sources of the frequency distortions which should be taken in account during the equalizer design. In the first place, these are the distortions caused by imperfection of ADC 51. Secondly, the equalizer 59 eliminates residual excessive attenuation at higher frequencies which remain after averaging because of the finite length of the sections [k·T/K, (k−1)·T/K], where 0≤k<K, and where the position of the waveform start is undefined. High speed ADCs are often built as an assembly of time interleaved sub-ADCs. To correct the misalignment of frequency responses of the sub-ADCs, special equalizers are used in conventional systems, which require a considerable amount of computing resources. When an averaging of waveforms is performed, the distortions caused by differences between sub-ADCs, are smoothed out so that special equalization is not necessary.

The above-described configuration of FIG. 5 is one of a number of possible embodiments of the present disclosure. For example, if the accumulator 54 in the configuration of FIG. 5 is built using a memory which performs writing to the cell and reading from the cell simultaneously (without division in time), then register 52 and the connection feeding the R/W input 54C of the accumulator (and the input itself) become unnecessary. The possible embodiments differ in features which are not of vital importance for operation of the disclosed apparatus. The common properties of these embodiments which are essential for the implementation of the present disclosure, are outlined in the following claims.

Figure 6:
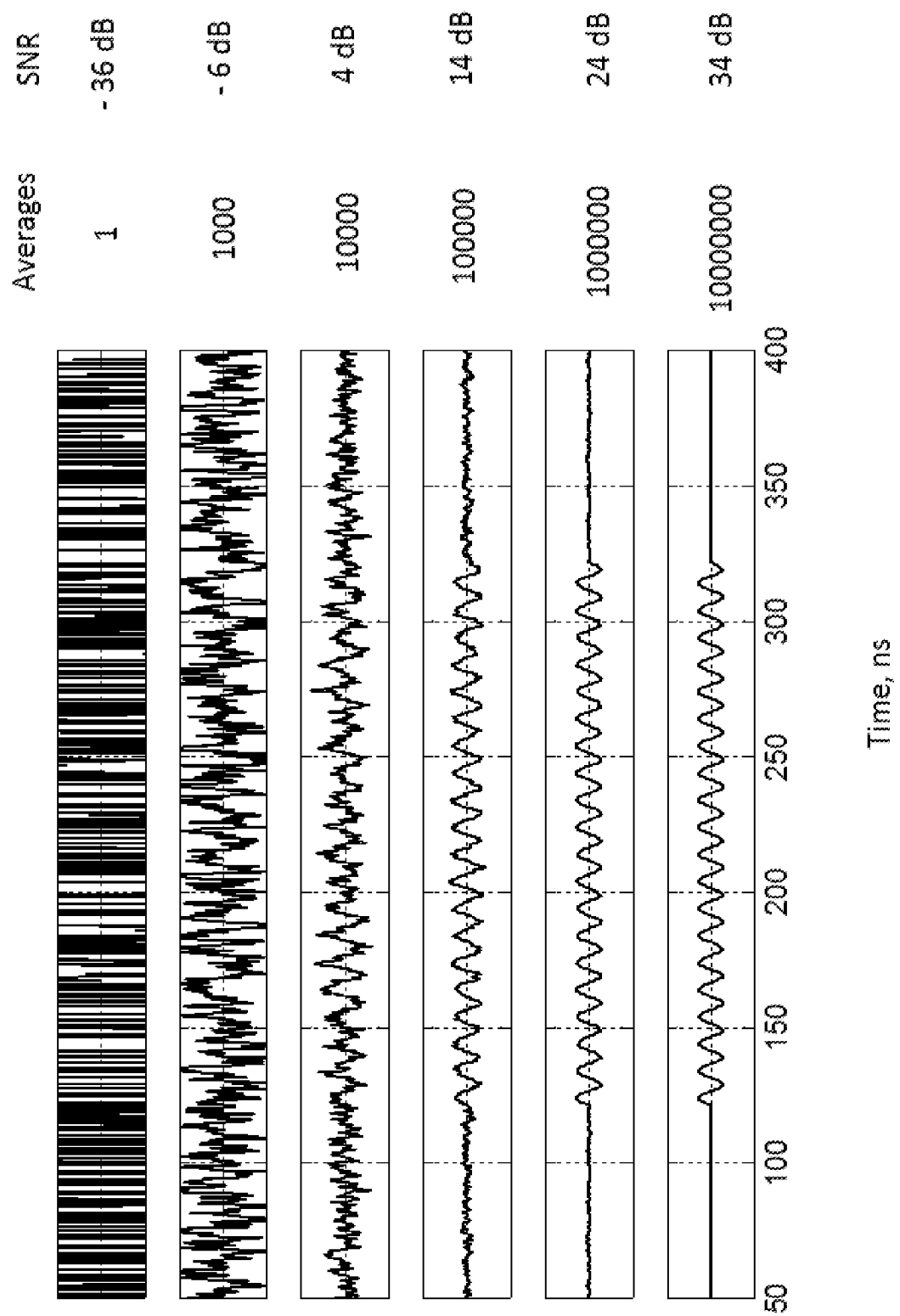
FIG. 6 illustrates results of real time waveforms averaging by a device built according the present disclosure and using a 16 GSA/s digitizer with for accumulator bins.

The method of noise suppression by averaging of a sequence of repetitive waveforms which has been described above, was implemented in a Guzik ADP7000 series digitizer using a 64 oversampling rate (four bins for the ADC with the sampling frequency at 16 GSa/s, and two bins with the sampling frequency at 32 GSa/s). FIG. 6 shows results of real time averaging in relation to the number of averaged waveforms. Initial sine wave bursts were corrupted by additive noise with SNR of −36 dB. After averaging of 10 million waveforms, this signal was detected with an SNR of 34 dB. The averaging was completed in 5 seconds, using a 2 MHz trigger repetition rate.

One skilled in the art will realize the subject disclosure may be embodied in other specific forms without departing from the spirit or essential characteristics thereof. The foregoing embodiments are therefore to be considered in all respects illustrative rather than limiting of the technology described herein. The scope of the subject disclosure is thus indicated by the appended claims, rather than by the foregoing description, and all changes that come within the meaning and range of equivalency of the claims are therefore intended to be embraced therein.

What is claimed is:

1. A method for suppressing noise in an analog signal characterized by a sequence of repetitive waveforms, comprising the steps of:
   in a first step:
   A. waveform processing the waveforms one after another, wherein the waveform processing step includes the sub-steps of:
      a. analyzing a mutual disposition of a trigger pulse marking a start of each waveform in the sequence and a sampling clock period T to determine a number k, where 0≤k<K, indicating a section [k·T/K, (k−1)·T/K] of the sampling period where a trigger pulse marking the start of the waveform, has appeared, wherein the number K and the sampling clock period T are parameters of the method;
      b. converting the analog signal into a stream of digital samples at an ADC sampling frequency characterized by a period T, whereby the stream is representative of the analog signal,
      c. numbering the samples in the stream in the order of their appearance by a number n, where 0≤n<N, and where N is a projected number of samples in the digital representation of the analog signal,
      d. storing the results of the waveform processing in a memory consisting of K·N cells, wherein cells of the memory are reset the to zero at the start of processing of a waveform, while each appearing sample is added to contents of a memory cell with an address produced by concatenation of the numbers k and n, and
   in a second step:
   B. outputting the stored results of the waveform processing, to form an output signal, wherein the outputting step includes the sub-steps of:
      a. generating memory cell addresses (k, n) one after another, with a memory output samples frequency equal to a product of the ADC sampling frequency and the number K;
      b. beginning the memory cell address generation from an address (0, 0) and by iteration forming a next address according to rules:
         i. increasing k by one, if k<K−1, while equating k to zero otherwise;
         ii. keeping n unchanged, if k<K−1, and increasing n by one otherwise;
      c. reading the contents of a memory cell with a next address (k, n) and putting the read value in the first auxiliary digital signal in a position K·n+k;
      d. converting the first auxiliary digital signal into a second auxiliary digital signal by transmitting it through an anti-aliasing lowpass filter with a cutoff frequency which is less than a half of the ADC sampling frequency,
      e. converting the second auxiliary digital signal into an output signal by way of decimation by a factor K.

2. An apparatus for suppressing noise in an analog signal characterized by a sequence of repetitive waveforms, comprising:
   A. a trigger pulse counter having a trigger counter input and a trigger count output, wherein the trigger pulse counter is responsive to system trigger pulses applied to the trigger counter input to provide a trigger count signal at the trigger count output representative of the number of system trigger pulses applied to the trigger counter input up to and including M system trigger pulses, where M is an integer, applied since a reset to zero of the trigger pulse counter, and being non-responsive to system trigger pulses applied to the trigger counter input after the $M^{th}$ system trigger pulse,
   B. a time displacement detector having
      i. a time displacement trigger input adapted to receive the system trigger pulses applied to the trigger count input,
      ii. a time displacement clock input adapted to receive a system clock signal including a succession of system clock pulses characterized by a sampling period T, and iii. a time displacement output,
wherein the time displacement detector after receiving an applied trigger pulse, is responsive to the trigger pulse and the system clock signal, to produce at the time displacement output, a number k representative of a $[T/K \cdot k, T/K \cdot (k+1)]^{th}$ section of a sampling period T in which the trigger pulse occurred, and maintains the number k unchanged up to the occurrence of a next trigger pulse, C. an analog to digital converter (ADC) characterized by an ADC cutoff frequency and having
  i. an ADC input adapted to receive an applied analog signal,
  ii. an ADC clock input adapted to receive the succession of system clock pulses as an ADC sampling signal, and
  iii. an ADC output,
  wherein the ADC is responsive to an analog signal applied to the ADC input, and the ADC sampling signal, to convert the applied analog signal to an ADC output digital signal representative of the applied analog signal and apply the ADC output digital signal to the ADC output, where the ADC output digital signal is a stream of samples of the applied analog signal, D. an adder having a first adder input adapted to receive the ADC output digital signal, a second adder input and an adder output, wherein the adder is responsive digital signals at its first adder input and second adder input, to provide at its adder output a sum signal representative of a sum of values associated with the digital signals at its first adder input and second adder input, E. an address counter including:
  i. an address counter clock input adapted to receive the succession of system clock pulses, wherein the address counter is adapted to increment upon receipt of each clock pulse in the succession;
  ii. a reset input adapted to receive the system trigger pulses, wherein the address counter is adapted to reset the address counter to zero upon receipt of each system trigger pulse, and
  iii. an address counter output providing a number n signal representative of the number of clock pulses n which have occurred since the last reset to zero of the address counter;

F. a concatenation unit including:
  i. a k input connected to the output of the time displacement detector, wherein the k input is adapted to receive the trigger count signal k;
  ii. a n input, wherein the n input is adapted to receive the number n signal;
  iii. a concatenation output, wherein the concatenation unit is operative in response to the successively generated trigger count signal k and the number n signal, to apply corresponding succession of accumulator address signals representative of successive concatenated values (k,n) at the a concatenation output;

G. an accumulator system including
  i. a plurality of accumulator memory cells characterized by distinct cell addresses,
  ii. a cell address input connected to the concatenation output;
  iii. a read/write control input,
  iv. an accumulator signal input coupled to the adder output, and
  v. an accumulator output, wherein the accumulator output is coupled by way of a register clocked by the system clock signal, to the second adder input, whereby a succession of values from the accumulator output are applied to the second adder input, and
  for the succession of clock pulses, the accumulator is responsive to the successive concatenated values (k,n) applied from the concatenation output to the cell address input, to access content of memory cells addressed by cell addresses corresponding to the successive concatenated values (k,n) and under control of a control signal at the read/write control input:
    (a) write into the addressed memory cells, values represented by the sum signals applied from the adder output by way of the accumulator signal input into the same memory cells, when the number k at the output of the trigger pulse counter is less than M, and then read the content of the addressed memory cells to the accumulator output, and
    (b) only read the content of the addressed memory cells to the accumulator output when the number k at the output of the trigger pulse counter is M, H. a modulus K bins counter having a bins counter input adapted to receive the succession of system clock pulses when the bins counter output is connected to its associated input of the concatenation unit when the number at the output of the trigger pulse counter equals M, I. an anti-aliasing lowpass filter and a decimator by K are coupled in cascade from the accumulator output, wherein an output of the decimator by K provides a system output.

3. An apparatus according to claim 2, further comprising an equalizer coupled to the system output, wherein the equalizer is adapted to adjust amplitude frequency response to compensate for the frequency distortions of the ADC and post-averaging residual frequency distortions.

4. An apparatus according to claim 3, the decimation is performed with a ratio which is less than K when the ADC cutoff frequency is higher than 1/2T, where T is the ADC sampling period.

* * * * *